United States Patent [19]
Millard et al.

[11] Patent Number: 5,179,279
[45] Date of Patent: Jan. 12, 1993

[54] NON-CONTACT ELECTRICAL PATHWAY

[75] Inventors: Don L. Millard, Clifton Park; Robert C. Block, Troy, both of N.Y.

[73] Assignee: Rensselaer Polytechnic Institute, Troy, N.Y.

[21] Appl. No.: 898,228

[22] Filed: Jun. 12, 1992

Related U.S. Application Data

[63] Continuation of Ser. No. 647,483, Jan. 25, 1991, abandoned.

[51] Int. Cl.$^5$ .................. H01J 37/00; G01R 31/28
[52] U.S. Cl. ........................... 250/309; 250/307; 250/423 P; 324/158 R; 324/158 P; 324/71.3
[58] Field of Search ............... 250/423 P, 306, 307, 250/309; 324/158 R, 158 P, 71.3

[56] References Cited
U.S. PATENT DOCUMENTS

| | | | |
|---|---|---|---|
| 4,644,264 | 2/1987 | Beha et al. | 324/158 R |
| 4,771,230 | 9/1988 | Zeh | 324/459 |
| 4,786,864 | 11/1988 | Beha et al. | 324/158 R |
| 4,970,461 | 11/1990 | LePage | 324/158 P |
| 5,017,863 | 5/1991 | Mellitz | 324/71.3 |
| 5,032,788 | 7/1991 | Ringleb et al. | 324/158 F |
| 5,122,737 | 6/1992 | Clauberg | 324/158 R |

*Primary Examiner*—Bruce C. Anderson
*Attorney, Agent, or Firm*—Notaro & Michalos

[57] ABSTRACT

A method and apparatus for establishing a non-contact signal pathway to conductive surfaces of a circuit includes a laser beam generator and an optical system for focussing a laser beam from the beam generator onto a plasma forming foil. The foil is positioned near the conductive surface so that the plasma touches the foil at a spot. The signal pathway is thus established between the foil and the conductive surface through the plasma. Signals can be applied to and read from the conductive surface through the pathway.

17 Claims, 8 Drawing Sheets

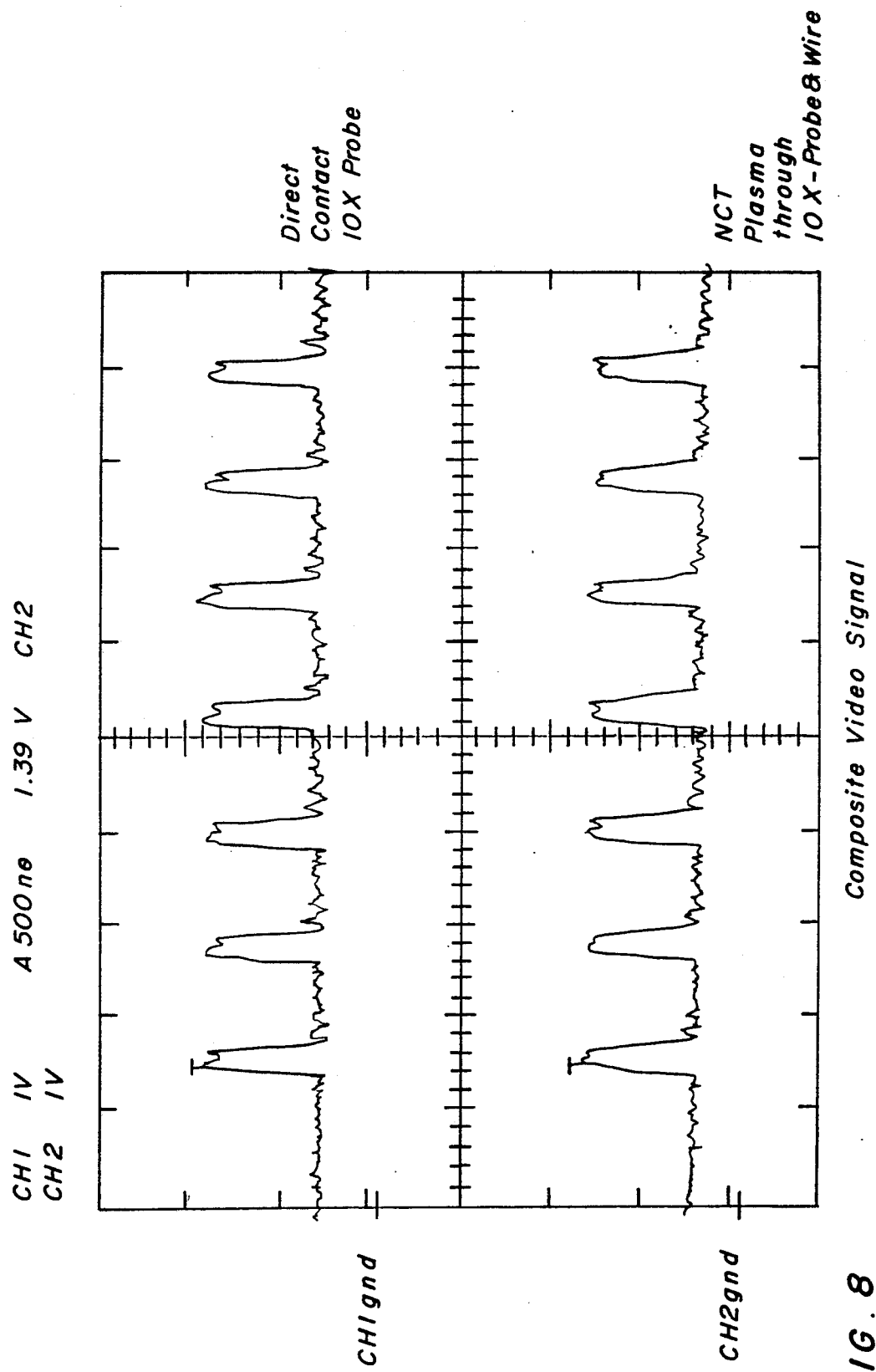

NON-CONTACT ELECTRICAL PATHWAY

This application is a continuation of application Ser. No. 07/647,483, filed Jan. 25, 1991, abandoned.

FIELD AND BACKGROUND OF THE INVENTION

The present invention relates in general to methods and apparatuses for monitoring signals from and injecting signals to functional electrical circuitry, and, in particular to a new and useful method and apparatus of achieving these functions without contacting the electrical circuitry. For this purpose, the present invention utilizes laser-induced photoionization which creates plasma volumes that are utilized for monitoring and injecting the signals.

Mechanical pin contact electrical testers have been used for many years to monitor signals from and inject signals to electrical circuitry. The testers are brought into contact with printed wiring boards (PWV) and thus make physical contact with the various conductive connections of the electrical circuitry connected to the wiring boards. The simultaneous reduction of printed wiring board features and the utilization of a multitude of imbedded signal layers has rendered the use of mechanical electrical testers obsolete.

Fragile, "one-chance" connectors on high density input/output (I/O) boards require electrical testing of PWB's without actually contacting the connectors.

Non-contact technology is not currently available however, to achieve this function.

Extremely expensive functional and in-circuit testing equipment is, however, currently available, for example from Digital Equipment Corporation (DEC). Without non-contact testing (NCT) methodology, it is not practical to utilize this equipment on fragile and complex circuitry.

SUMMARY OF THE INVENTION

The present invention comprises a method and an apparatus for establishing a signal pathway to and from a circuit through at least one conductive surface of the circuit, by utilizing laser beam generated, plasma photoionization and magnetic control and constraint of the plasma photoionization.

The present invention is thus capable of producing a non-loading electrical pathway to and from fragile complex circuitry, which allows high speed dynamic electrical measurements to be made. The present invention may also be utilized for non-contact partitioning of circuitry and non-contact power applications. This includes tasks such as ROM programming, non-contact exercising of circuitry and plasma-based electrical signal mixing and modulation.

The present invention overcomes several problems which are inherent in the use of laser beam generated photoionization plasma.

The first of these is to reduce the diameter of the laser beam coming from its source, as well as the resulting plasma. The reduction of laser beam and plasma diameters is essential to reduce the size of the plasma "spot" applied to the conductive surface of a circuit to be tested or to which a non-contact electrical pathway is to be established. The reduction of the plasma spot size is particularly important to avoid crosstalk between small, closely spaced conductive surfaces or contacts which are provided, for example, on a PWB, to which the circuitry is connected.

A series of experiments has verified the usefulness of a particular optical configuration used in accordance with the present invention.

Another potential difficulty involves magnetic influences on the ionization path.

A second series of experiments verified the absence of adverse effects due to magnetic fields upon the ionization path. These tests included crosstalk measurements. The experiments revealed that no significant differences in the crosstalk measurements existed in the presence or absence of a magnet. It was observed that crosstalk was still prevalent in experiments performed using the magnet. This demonstrated that there is in fact little potential for magnetic constraint of the plasma and little adverse effect due to magnetic fields.

A further series of tests demonstrated the repeatability and observability of the signals transferred to and received from complex circuitry using the plasma-based, non-contact technique of the invention. A non-contact connection was established with a Teradyne Model No. 854-466-01 prober handle. A CMOS oscillator circuit was utilized to generate signals which were present at associated conductive surfaces or pads of a printed wiring board. These experiments characterize the observation process in conjunction with appropriate laser parameters. Signal integrity was then evaluated by phase shift measurements using both contact and non-contact techniques. A further experiment demonstrated that signals could be observed on a fully operational DEC VT 100 terminal. The Teradyne probe and its associated electronics were utilized for this experiment.

Accordingly, an object of the present invention is to provide a method of establishing a signal pathway to at least one conductive surface of a circuit, which comprises generating a laser beam, focusing the laser beam onto a plasma forming member to form a plasma, and directing the plasma toward the conductive surface to establish a signal pathway between the plasma forming member and the conductive surface.

A further object of the present invention is to provide an apparatus for establishing a signal pathway to at least one conductive surface of a circuit, comprising means for generating a laser beam, means for focusing the laser beam onto a plasma forming member to form a plasma, and means for directing the plasma toward the conductive surface for establishing the signal pathway between the plasma forming member and the conductive surface.

By utilizing the method and the apparatus of the present invention, a variety of highly complex, high frequency signals can be applied to and received from a large number of conductive surfaces for the circuit, without contacting the surfaces.

A still further object of the present invention is to provide a method and apparatus for establishing a signal pathway to and from electronic circuitry, which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

BRIEF DESCRIPTION OF THE DRAWINGS

In the drawings:

FIG. 8 is a waveform diagram showing a close correlation between the signals obtained with the prior direct contact technique and the non-contact technique of the present invention, the signals being obtained during tests conducted on the PWB of a DEC VT 100 terminal.

DESCRIPTION OF THE PREFERRED EMBODIMENTS

Figure 1:
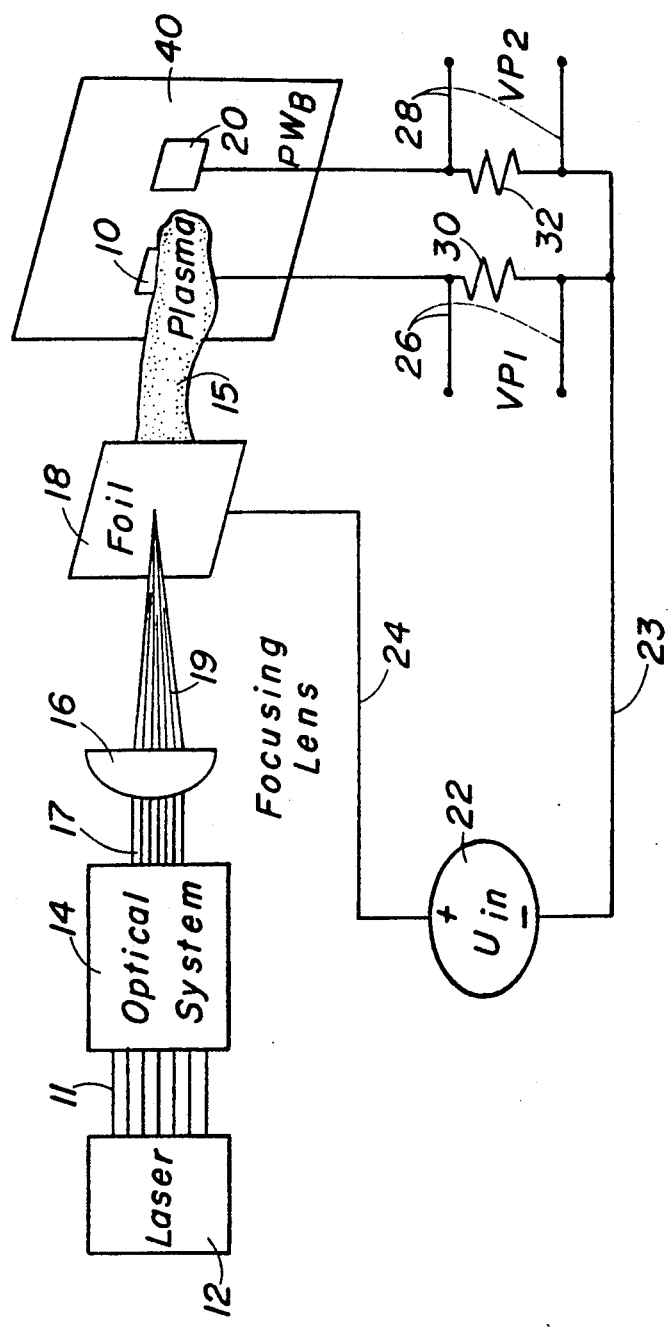
FIG. 1 is a schematic diagram of an apparatus according to the present invention for practicing the method of the present invention.

Referring to the drawings in particular, the invention embodied in FIG. 1 comprises an apparatus for the non-contact testing (NCT) of circuitry by the establishment of electronic pathways for signals to at least one conductive surface or pad of the circuitry, through a photoionization plasma 15.

To generate the plasma 15, a laser 12 which is advantageously a pulsed laser, is activated to generate a laser beam 11 whose diameter is initially about 5 mm. The beam diameter is reduced by passing the beam through an optical system 14. The beam 17 with reduced diameter is then focused by a focussing lens 16 onto a plasma forming member 18, which for example, may be a wafer or foil of tungsten. The focused laser beam 19 is directed toward the surface of foil 18 and forms a hole in the foil which yields a strand or stream of plasma 15 on the opposite side of the foil. Careful positioning between the foil 18 and a printed wiring board (PWB) 40 places a spot of the plasma on the surface of the board. By moving the board 40 laterally to the optical axis for the laser beam and plasma stream, the spot of plasma can be selectively brought to the surface of conductive areas or pads 10 and 20 which represent circuit board connections.

To establish the usefulness of the present invention, a DC voltage source 22 was connected by a wire 23 and through loads 30 and 32 to respective conductive pads 10 and 20. Leads 26 were utilized to measure the voltage drop VP1 across load 30 and leads 28 were utilized to measure the voltage drop VP2 across the load 32. Leads 26 and 28 were connected to separate channels of an oscilloscope for this purpose.

Figure 2:
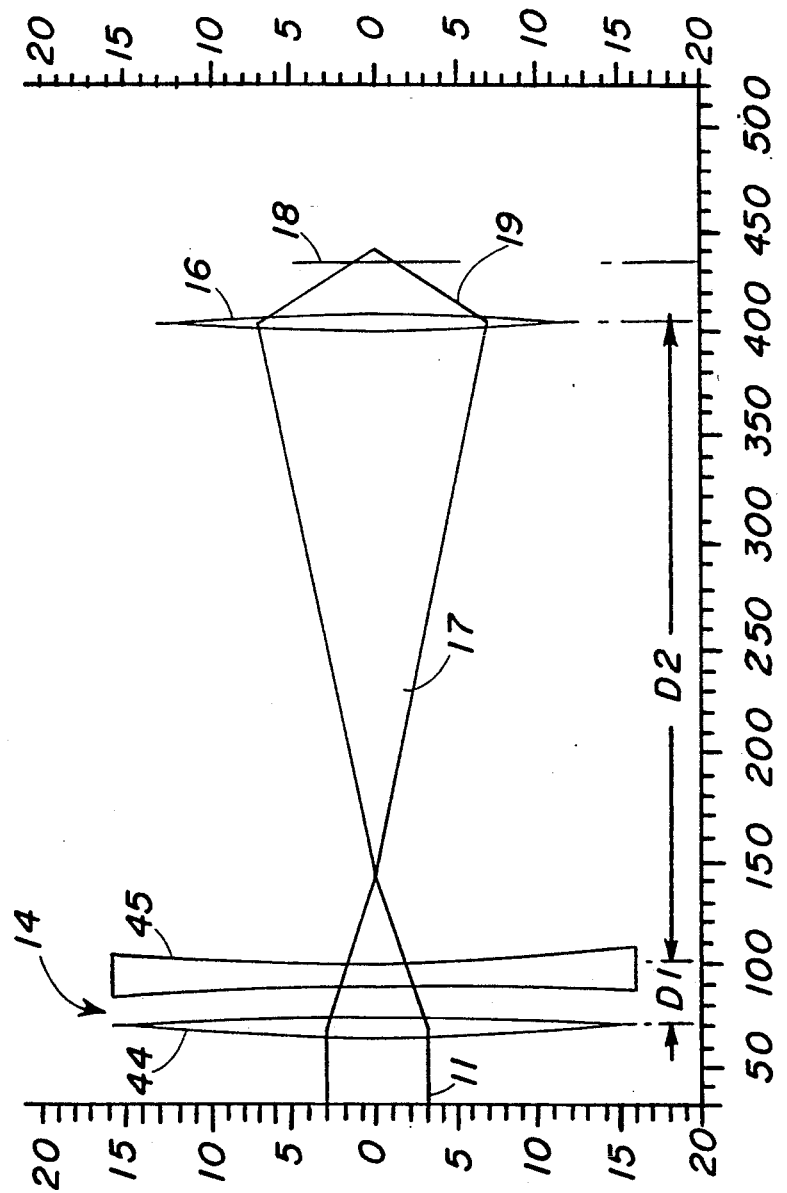
FIG. 2 is a schematic lens diagram shown the optical setup utilized in the present invention.

FIG. 2 illustrates the lens setup for the optical system 14 and focussing lens 16.

Optical system 14 comprised a lens pair including a converging lens 44 and a diverging lens 45. The lenses were spaced by a center-to-center distance of D1.

The focussing lens 16 was a converging lens at a distance D2 from the diverging lens 45.

The PWB 40 (not shown in FIG. 2) was placed at approximately 1 mm from the foil 18.

The distance between the focussing lens 16 and foil 18 was adjusted after the plasma stream 15 had been struck, by moving the lens and/or foil until the sound of the plasma striking the foil reached a maximum level. This was done at low repetition rates for the pulsed laser 12. After the sound reached its maximum, the repetition rate was increased to between 5 and 20 pulses per second until a hole was drilled through the foil 18.

Figure 3:
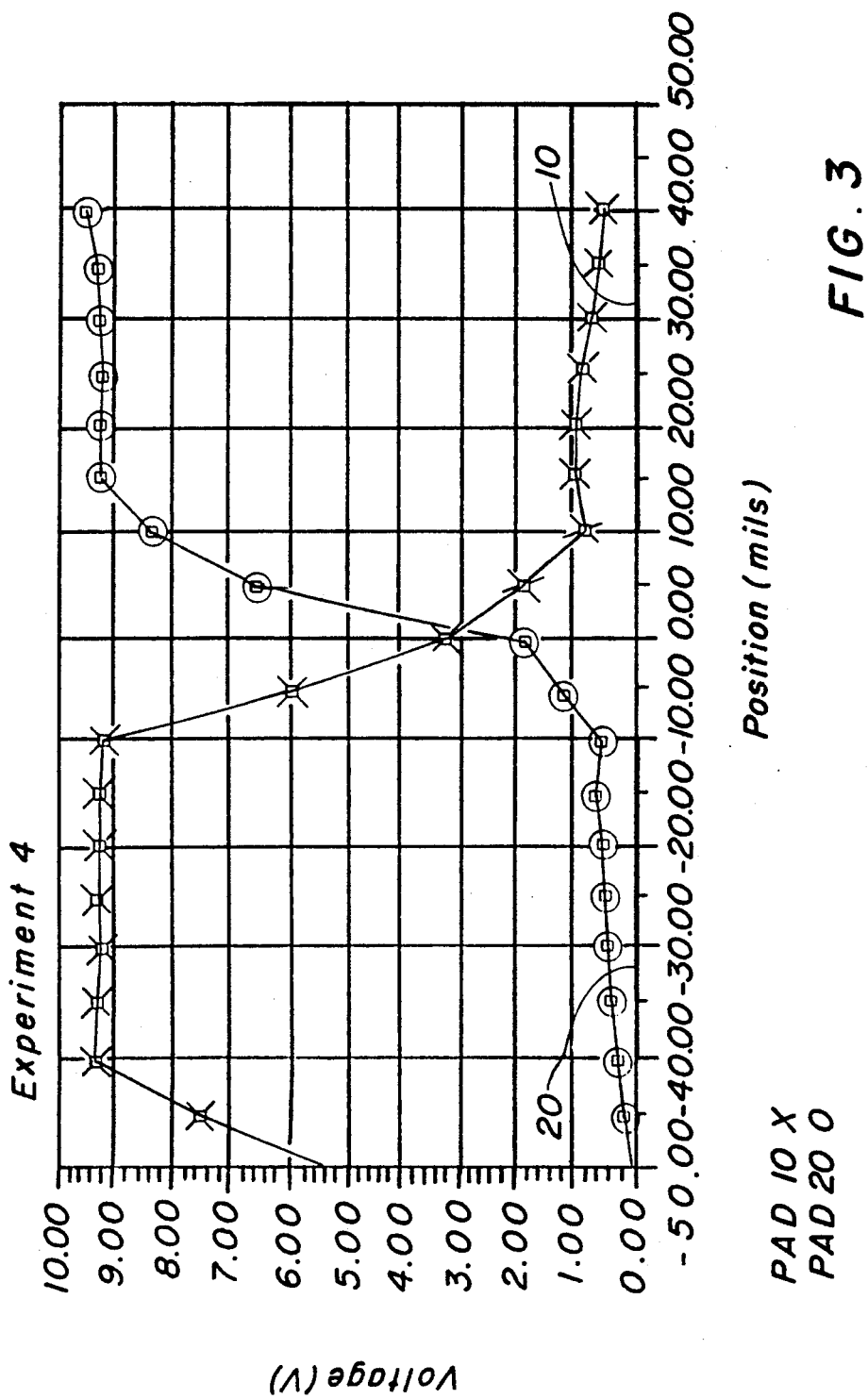
FIG. 3 is a graph plotting the voltage measured through the non-contact plasma pathway, plotted against position across a pair of conductive pads to illustrate the crosstalk characteristics of the signal between the two pads.

Pads 10 and 20 are schematically illustrated in the graph of FIG. 3 on the horizontal axis.

The pads had a pitch or center-to-center separation of 50 mil (0.050 inch) and each pad had a size of 30 mil and a pad-to-pad separation of 20 mil. 10 volts DC was used as $V_{IN}$ from voltage supply 22 and VP1 and VP2 were measured on channels 1 and 2 of the oscilloscope.

The PWB 40 in the setup of FIG. 1, was mounted on a micrometer-control moving platform. As plasma 15 was formed, it reached out and created an electrical connection with one or both of the pads 10 and 20 on board 40. Board 40 was initially placed such that a signal was only observed at path 10. It was then moved in increments of 5/1000 in. Table 1 shows the results of 24 experiments that were conducted with a variety of lenses at a variety of distances.

FIG. 3 shows the voltages which were measured at pads 10 and 20 as the plasma spot moved across the board 40.

At each position, two measurements of VP1 and VP2 were made. The experimental results shown in FIG. 3 demonstrate the crosstalk characteristics between the two pads. The value used to determine the amount of crosstalk was the voltage 10 micro-seconds after the scope was triggered. The board 40 was then moved while measurements were taken until the point at which the signal was only obtained on pad 20.

For the experiments in Table 1, two lens pairs were used in conjunction with three focussing lenses.

TABLE 1

| Exp # | D1 | D2 | Vp1 | Vp2 |
|---|---|---|---|---|
| 1.00 | 20.00 | 312.50 | 9.40 | 9.50 |
| 2.00 | 22.00 | 313.00 | 9.42 | 9.46 |
| 3.00 | 24.00 | 310.00 | 9.28 | 9.42 |
| 4.00 | 26.00 | 308.00 | 3.26 | 1.82 |
| 5.00 | 20.00 | 305.00 | 9.76 | 9.60 |
| 6.00 | 22.00 | 311.50 | 2.08 | 2.00 |
| 7.00 | 24.00 | 309.50 | 9.32 | 9.58 |
| 8.00 | 26.00 | 307.50 | 9.72 | 9.56 |
| 9.00 | 20.00 | 286.00 | 9.16 | 9.26 |
| 10.00 | 22.00 | 284.00 | 9.40 | 9.44 |
| 11.00 | 24.00 | 282.00 | 9.40 | 9.24 |
| 12.00 | 26.00 | 280.00 | 7.04 | 5.36 |
| 13.00 | 20.00 | 355.00 | 9.32 | 9.28 |
| 14.00 | 22.00 | 355.00 | 9.00 | 9.32 |
| 15.00 | 24.00 | 353.00 | 8.96 | 8.92 |
| 16.00 | 26.00 | 351.00 | 6.64 | 3.96 |
| 17.00 | 20.00 | 355.00 | 0.56 | 1.00 |
| 18.00 | 22.00 | 216.00 | 9.04 | 8.96 |
| 19.00 | 24.00 | 214.00 | 9.28 | 9.36 |
| 20.00 | 26.00 | 212.00 | 9.16 | 9.32 |
| 21.00 | 20.00 | 349.00 | 9.44 | 9.52 |
| 22.00 | 22.00 | 347.00 | 9.22 | 9.06 |
| 23.00 | 24.00 | 161.50 | 9.42 | 9.50 |

TABLE 1-continued

| Exp # | D1 | D2 | Vp1 | Vp2 |
| --- | --- | --- | --- | --- |
| 24.00 | 26.00 | 159.50 | 9.74 | 9.78 |

The first lens pair contained a 50 mm focal length 70 mm diameter converging lens coupled with a −51 mm focal length 90 mm diameter diverging lens. The second lens pair contained a 79 mm focal length 70 mm diameter converging lens coupled with a −81 mm focal length 90 mm diameter diverging lens. The three converging focussing lenses had focal lengths of 15 mm, 24 mm and 31.7 mm respectively and diameters of 447 mm, 434.5 mm and 402.5 mm respectively.

Each lens pair for the set of experiments was employed at four separation distances (20 mm, 22 mm, 24 mm and 26 mm), for each focussing lens. Experiments 1 through 4 utilized the first shorter focal length lens set with the 31.7 focal length focussing lens. Experiments 5–8 used the second longer focal length lens pair with the 31.7 focal length focussing lens. Experiments 9–12 used the longer focal length lens pair with the 24 mm focal length focussing lens. Experiments 13–16 utilized the longer focal length lens pair with the 15 mm focal length focussing lens.

The shorter focal length lens pair with the 15 mm focal length focussing lens were used for experiments 17–20 and the shorter focal length lens pair was utilized with the 24 mm focal length focussing lens for experiments 21–24.

Of all the experiments, the most promising results were achieved for experiments 4 and 17. Experiment 4 was ultimately successfully reproduced.

The results demonstrate, in general, the usefulness of a plasma stream to establish a non-contact electrical connection with conductive surfaces of a circuit board, where the surfaces are closely spaced, and where crosstalk between the surfaces is within useful limits so that signals can be applied to or read from the conductive surfaces without interference between adjacent surfaces.

Another phenomenon revealed by the experiments involved the creation of a hole through the foil before the last measurement of one of the experiments (experiment 6) was completed. Data after the hole was formed (not shown) showed a great reduction in crosstalk. This was assumed to be caused by the plasma filtering through the previous hole and making contact with the board 40. From this, it appears that focussing the laser onto the foil and allowing a plasma to filter through the foil at a predetermined location would improve crosstalk signal reduction further. Accurate alignment of the laser beam is necessary to achieve this effect.

Experiments were also conducted to determine the effect, if any, of a magnetic field on the plasma stream.

These experiments revealed that even with the presence of a Cobalt disk magnet behind the PWB 40, overlapping the pads 10 and 20, no change in the crosstalk or voltage measurements took place. This reveals that magnetic based plasma control is not useful to achieve the present invention.

The results illustrated in Table 1 and in FIGS. 3, demonstrate the usefulness of the present invention for DC signals.

Figure 4:
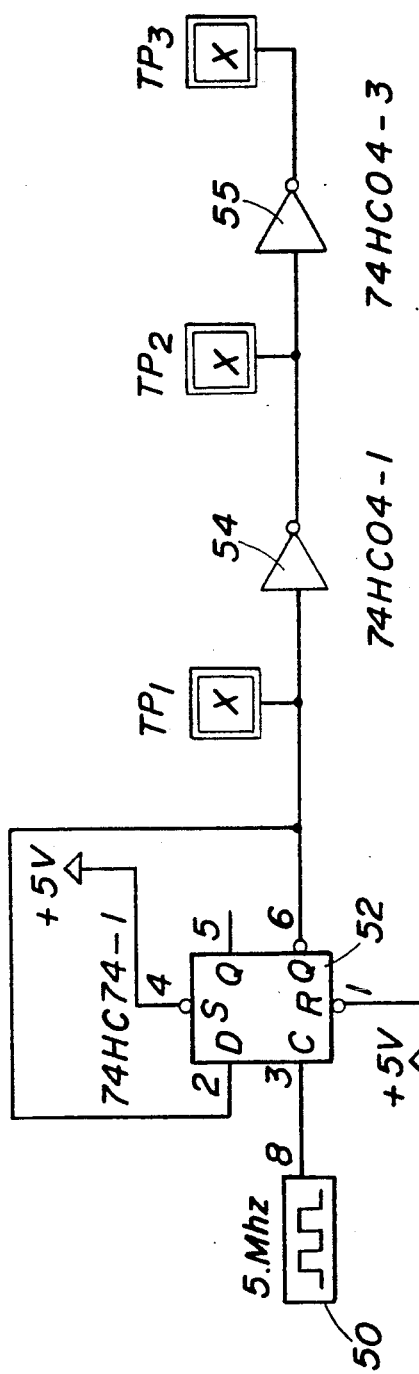
FIG. 4 is a block diagram of a test circuit utilized to verify the usefulness of the present invention.

FIG. 4 is a schematic diagram of a circuit which was utilized to establish the usefulness of the present invention for AC signals.

The circuit of FIG. 4 comprises a "Dale" 5 MHz crystal oscillator 50 which contains a high speed (CMOS) analog/digital oscillator circuit. The signal from oscillator 50 was applied to the C input of a 74 HC74 (high speed/CMOS) dual-flip-flop integrated circuit 52. The output of the flip-flop 52 was applied to two 74 HC 04 hex inverters 54 and 55. The final inverter output which could be tapped at a conductive tab TP3, should have been a 2.5 MHz square-wave signal with an amplitude from 0 to 5 volts. The actual measured waveforms are illustrated in FIGS. 5 and 6.

These experiments were conducted to determine the reliability of testing using the invention, the effect that a non-contact testing technique would have on the measured signals, the effect of disturbances in a circuit caused by probing a particular signal of that circuit through the non-contact testing of the present invention, and further, the effectiveness of a single laser pulse as opposed to the multiple pulses used in the DC tests.

Figure 5:
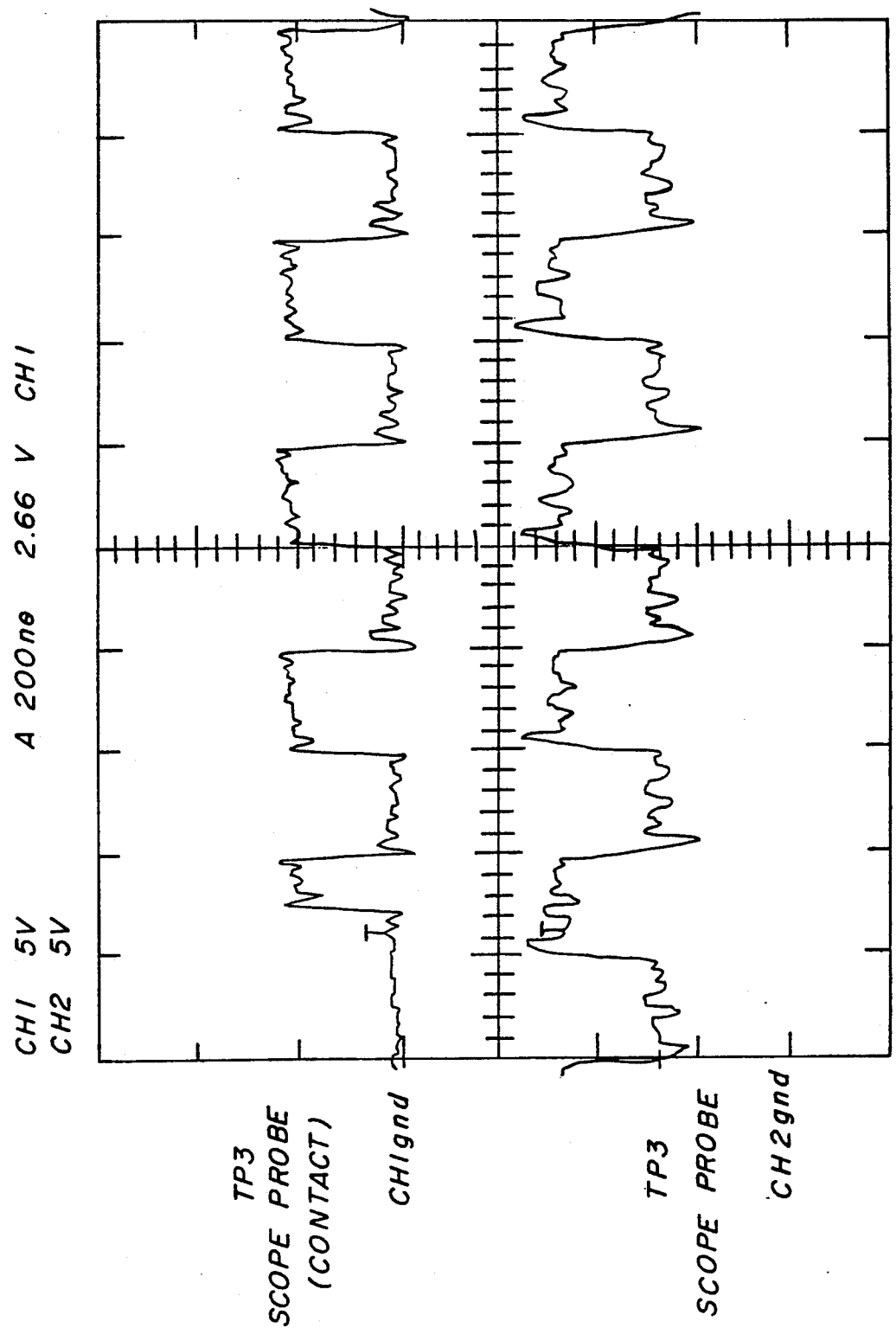
FIG. 5 is a waveform diagram illustrating the waveform obtained on an oscilloscope having a probe in actual contact with one of the pads of the circuit shown in FIG. 4.
Figure 6:
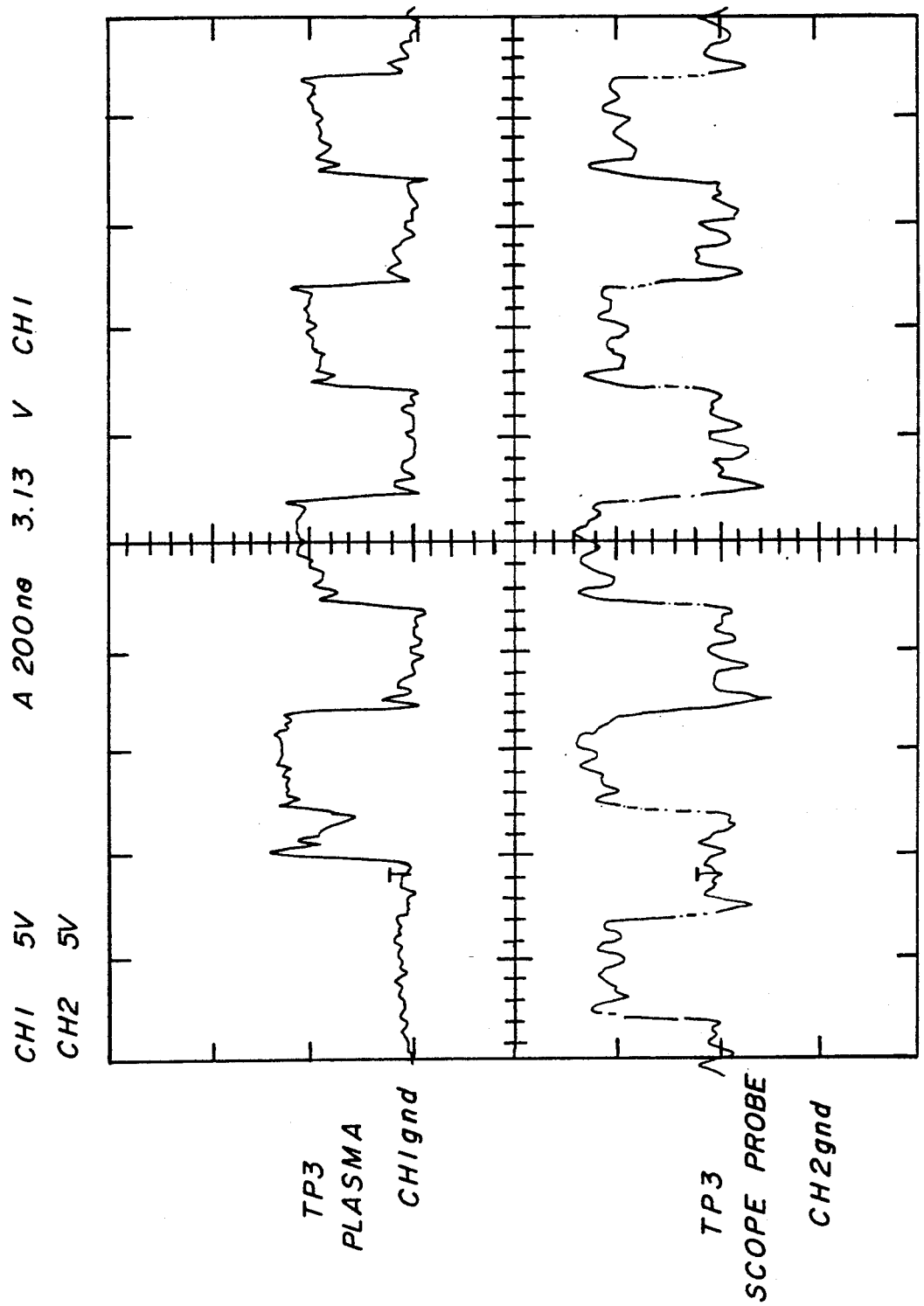
FIG. 6 is a waveform diagram similar to FIG. 5 but with a plasma generated in accordance with the present invention and utilized for establishing a non-contact pathway to the pad.

The experimental procedure for generating the signals illustrated in FIGS. 5 and 6 utilize a setup similar to that of FIG. 1 except without the optical system 14 and with only a single pad on the board 40.

A 150 mJ pulse laser was utilized as the laser source and was focussed on a sight of interest using a single 31.7 mm focal length converging lens. This allowed for capture of the voltage signal on an oscilloscope. A tungsten foil or wafer having a 1 mil thickness was utilized and was placed at the approximate focal point of the lens. A hole in the wafer allowed the ionization to pass through the foil so that the plasma "touched" the pad for establishing a non-contact electrical pathway.

The single laser pulse was used to investigate the potential of AC observations on the PWB and to acquire a "snap-shot" of the signal. Approximately 4–6 micro seconds of the 1.25 or 2.5 MHz signal was captured on the oscilloscope. This technique utilized two channels of the oscilloscope, one for the signal present at one test pad (TP1 to TP3) on the test circuit and the second for the signal at the probe end of the plasma, connected to the same or another test pad. The final results show the approximate correlation between the outputs which, as shown in FIG. 5, were achieved by actual physical contact with the probe (according to the prior art) and in FIG. 6 where the non-contact electrical pathway through the plasma was achieved.

Other experiments (not shown) demonstrated the lack of disturbance from one pad to another in a different test circuit which utilized two flip-flops (not shown).

This same circuit was also utilized to demonstrate that probing one input of a device will not disturb the device's output. No false clocking of the final flip-flop was observed due to probing the input of the first flip-flop.

Figure 7:
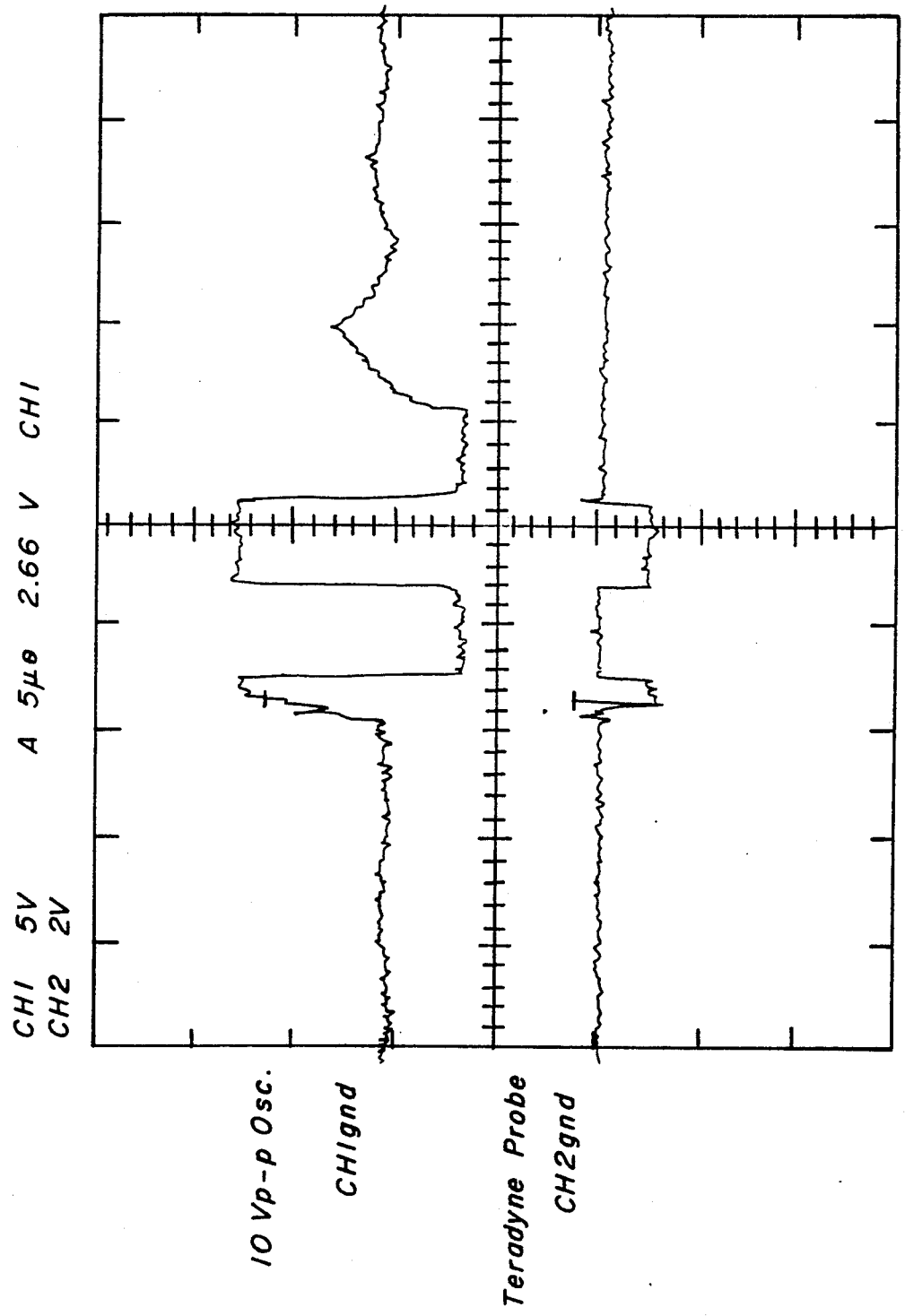
FIG. 7 is a waveform diagram showing, the results of an experiment using a signal generator and a Teradyne probe in conjunction with AC testing of the present invention.

FIG. 7 shows the results where a signal generator and Teradyne probe electronics were used in conjunction with a non-contact testing of the present invention. A 100 KHz, 10 Vp-p square wave from an oscillator was utilized. The signal was measured as in the previous tests where the second channel (CH2) input of the oscilloscope was connected to the output of the Teradyne probe. CH1 represented the signal that the probe "saw" throughout the plasma lifetime.

This demonstrates the feasibility of non-contact probing of the present invention for high frequency signals.

Other tests were also conducted (now shown) to evaluate phase shift which may be introduced by the present invention. Any phase shift which was observed was near the resolution capacity for the equipment utilized (a 100 MHz Tektronix Digital Sampling Scope).

To further verify the usefulness of the present invention, the invention was applied to the PWB of a DEC VT 100 terminal. This experiment was performed using a 31.7 mm focal length converging lens as the only optical component. The lens was placed at the 427 mm mark on a rail carrier with the flat part of the lens facing the PWB. The foil was placed at 31.1 mm from the lens and approximately 1 mm from the PWB. For alignment purposes, a helium-neon laser was aligned with a Photonics pulsed laser using a beam-splitter to place a dot on the PWB test area. A Unidex VI controller and translation alignment stage was used to position the PWB at the plasma site. The entire setup was controlled at the remote VT 100 terminal under test, the PWB for the terminal having been removed from its housing and held vertically in an optical mount.

Three types of measurements were performed while the VT 100 was operated with its screen full of E's. This substantially uniform pattern made it readily apparent if the screen flickered while the test was being performed. The first measurement consisted of directly connecting the monitor signal to channel 1 of the oscilloscope while capturing the same signal on channel 2 by probing the same point in the circuit. This test was done to simulate the effect of connecting a second probe to the circuit, in order to generate a test signal for comparison with the case using the plasma.

FIG. 8 illustrates one of the signal patterns which was utilized, showing a virtually identical correlation between the direct contact probe and the plasma probe of the present invention.

While a specific embodiment of the invention has been shown and described in detail to illustrate the application of the principles of the invention, it will be understood that the invention may be embodied otherwise without departing from such principles.

What is claimed is:

1. An apparatus for establishing a signal pathway in ambient air, to at least one conductive surface of a circuit, comprising:
    a pulsed laser for forming a laser beam pulse;
    a plasma forming member which forms a photoionization plasma when struck by a laser beam pulse, said plasma forming member being mounted at a non-contained, open location in ambient air, adjacent to and spaced by a small distance from the at least one conductive surface of the circuit by an open space containing air; and
    beam directing means for directing the laser beam pulse toward the plasma forming member for creating a plasma in the open space which strikes the conductive surface, a signal pathway being established in the open space between the plasma forming member and the conductive surface through the plasma.

2. An apparatus according to claim 1, wherein the beam directing means comprises an optical lens system for reducing the diameter of the laser beam pulse and focussing the laser beam pulse toward the plasma forming member.

3. An apparatus according to claim 2, wherein the plasma forming member comprises a metal foil.

4. An apparatus according to claim 3, wherein the optical lens system includes at least one lens pair having a first spacing and a focussing lens at a second larger spacing, from said lens pair.

5. An apparatus according to claim 4, wherein one lens in said lens pair is a converging lens and the other lens in said lens pair is a diverging lens, said focussing lens being a converging lens.

6. An apparatus according to claim 5, wherein said focussing lens is between said lens pair and said plasma forming member, said diverging lens being between the converging lens in said lens pair and said focussing lens.

7. An apparatus according to claim 2, wherein said optical lens system includes at least one lens pair having a first spacing and a focussing lens at a second larger spacing from said lens pair.

8. An apparatus according to claim 7, wherein one lens in said lens pair is a converging lens and the other lens in said lens pair is a diverging lens, said focussing lens being a converging lens.

9. An apparatus according to claim 8, wherein said focussing lens is between said lens pair and said plasma forming member, said diverging lens being between the converging lens in said lens pair and said focussing lens.

10. An apparatus for establishing a signal pathway to at least one conductive surface of a circuit, comprising:
    a pulsed laser for forming a laser beam pulse;
    a plasma forming member which forms a photoionization plasma when struck by a laser beam pulse, said plasma forming member being mounted at a non-contained, open location adjacent to and spaced from the at least one conductive surface of the circuit by an open space; and
    beam directing means for directing the laser beam pulse toward the plasma forming member for creating a plasma in the open space which strikes the conductive surface, a signal pathway being established in the open space between the plasma forming member and the conductive surface through the plasma.

11. An apparatus according to claim 1, wherein the spacing between the plasma forming member and the conductive surface of the circuit is on the order of 1 mm.

12. A method of establishing a signal pathway in ambient air, to at least one conductive surface of a circuit, comprising:
    generating a laser beam pulse;
    focussing the laser beam pulse onto a plasma forming member to form a plasma; and
    directing the plasma in an open, non-contained space containing ambient air toward the conductive surface for establishing a signal pathway over the plasma between the plasma forming member and the conductive surface in the open space containing ambient air, the plasma forming member being very close to the conductive surface.

13. A method according to claim 12, including focussing said laser beam pulse to reduce the diameter of said laser beam pulse.

14. A method according to claim 13, including focussing the laser beam pulse through an optical system containing a lens pair with closely spaced lenses and a focussing lens spaced by a greater distance from said lens pair than the spacing in said lens pair.

15. A method according to claim 14, wherein said lens pair includes one converging and one diverging lens, said focussing lens comprising a converging lens.

16. A method of establishing a signal pathway to at least one conductive surface of a circuit, comprising:

generating a laser beam pulse;
focussing the laser beam pulse onto a plasma forming member to form a plasma; and
directing the plasma in an open, non-contained space toward the conductive surface for establishing a signal pathway over the plasma between the plasma forming member and the conductive surface in the open space.

17. A method according to claim 12, wherein the plasma forming member is on the order of 1 mm from the conductive surface.

* * * * *